Dec. 12, 1961 O. GARRETA 3,013,161

NON LINEAR SEMICONDUCTOR ELEMENT

Filed Nov. 3, 1958

OLIVIER GARRETA

BY: Cushman, Darby & Cushman
ATTORNEYS

United States Patent Office 3,013,161
Patented Dec. 12, 1961

3,013,161
NON LINEAR SEMICONDUCTOR ELEMENT

Olivier Garreta, Paris, France, assignor to Compagnie Generale de Telegraphie Sans Fil, a corporation of France Filed Nov. 3, 1958, Ser. No. 771,650
Claims priority, application France Nov. 14, 1957
1 Claim. (Cl. 307—88.5)

The present invention relates to a linear semiconductor element, and more particularly, to elements of this type capable of operating as mixers at high frequencies, with a background noise which is lower than that of conventional mixers.

A non linear semiconductor element according to the invention comprises a junction transistor with a low punch-through voltage, the base electrode of which is free of any connection, said transistor being used as a diode, with its emitter and its collector as the two diode electrodes, at very low operating temperatures, for example of the order of those of liquid air or helium.

It is well known that the punch-through voltage of a transistor is the potential difference which, when applied between the emitter and the collector electrodes with the base of the transistor free of any connection, causes the Schottky barrier surrounding the collector to get in contact with the emitter. If current I flowing through the transistor is plotted as a function of voltage V applied between the emitter and the collector electrodes, as mentioned above, it is seen that current I increases suddenly when V exceeds a value $V_p$ which is precisely the punch-through voltage of the transistor.

Transistors generally present a high punch-through voltage and are operated at voltages well below this value. On the contrary, according to the invention, the transistors used show a very low punch-through voltage, and are obtained by providing a very thin base region, for example of the order of a few microns, the punch-through voltage being comprised, for instance, between about fifteen volts and .5 volt, the lower values being preferred for reasons to be stated.

The invention will be best understood from the following description and appended drawing, in which.

Figure 1:
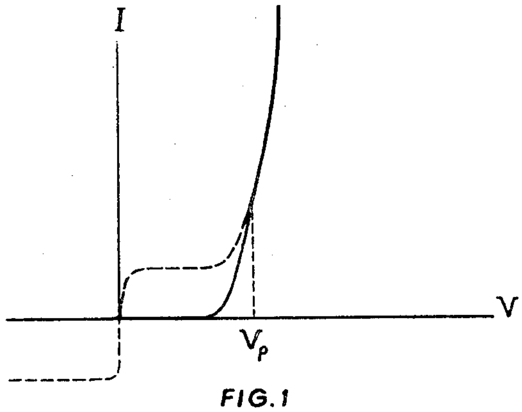
FIG. 1 is a diagram obtained by plotting current I along the abscissa and voltage V along the ordinate under the conditions stated above, and illustrating the punch-through voltage $V_p$.

Referring to FIG. 1, the portion of the V–I characteristic corresponding to voltages higher than the punch-through voltage $V_p$ is represented by the same curve, whatever the ambient temperature; however, for voltage values lower than $V_p$ there are two characteristics, one shown as a solid line and corresponding to very low temperatures and one shown as a dotted line and corresponding to normal ambient temperatures.

The curve portion in dotted line corresponds to a substantial reverse current of, for instance, a few dozens $\mu$a., at the ambient temperature, whereas, at very low temperatures, the reverse current approximates zero, being lower than one $\mu\mu$a. At very low temperatures, the characteristic portion corresponding to voltages lower than the punch-through voltage, presents therefore a marked curvature which corresponds to interesting non-linear properties.

The invention makes use of such non linear properties by operating the above described semiconductor as a rectifier or as a mixer with applied voltages in the vicinity of $V_p$.

Figure 2:
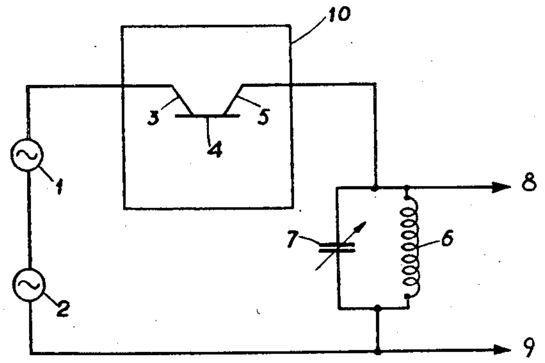
FIG. 2 shows diagrammatically a mixer arrangement using a low punch-through voltage transistor according to the invention.

In the mixer arrangement shown in FIG. 2, the high frequency signal from source 1 and the signal from the local oscillator 2 are both applied to emitter 3 of a low punch-through voltage, germanium junction transmitter, the base electrode 4 of which is free of any connection.

Collector 5 of the transistor is connected to an oscillatory circuit consisting of an inductance coil 6 and a capacitor 7. The output terminals 8 and 9 of the arrangement are connected to an intermediate frequency amplifier (not shown).

Transistor 3, 4, 5 is located in a casing 10 refrigerated, for example, to the temperature of liquid helium.

The arrangement operates in the neighbourhood of the punch-through voltage: to this end it should be suitably biased either by means of an auxiliary battery, or, more simply, as in the case of FIG. 2, by selecting a suitable value of the voltage for the local oscillator. It is desirable that $V_p$ be low, in order that the polarization current be small and also since the curvature of the characteristic and, consequently, the detection efficiency is the higher as $V_p$ is lower.

Figure 3:
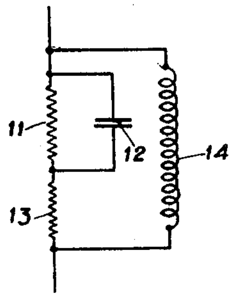
FIG. 3 is a circuit equivalent to a conventional detector circuit.

FIG. 3 shows the conventional equivalent circuit of a crystal detector, without its casing and disregarding the impedance of the connexion and the point contact impedance. This circuit comprises a non linear rectifying resistance 11, the stray capacitance 12 of the rectfying barrier capacity, the series resistance 13 and the inductance 14 of a resonant system associated with the crystal.

It is well known that, in a crystal mixer, a part of the current, which cannot be disregarded at higher frequencies, flows through stray capacitance 12, instead of flowing through the rectifying resistance 11. The elimination of the action of the stray capacitance 12, by tuning the circuit it builds up together with resistance 13 and inductance coil 14, is practically impossible, on account of the fact that resistance 13 is not negligible. The efficiency of the arrangement is thus reduced at high operating frequencies. This is not the case for the system of FIG. 2 where there is no stray capacitance 12.

Another important advantage of the mixer according to the invention lies in the fact that, under the operating conditions of the invention, i.e. at a very low temperature, background noise is much lower than that of the crystal mixer, operating at a normal temperature. It is well known that output noise of a mixer as collected at the input of the intermediate frequency stage, is equal to the noise due to thermal agitation which would be produced by a resistance subjected to a temperature proportional to the actual ambient temperature, the proportionality coefficient, which is higher than unity, being known as the "temperature coefficient" of the mixer.

In the case of the mixer according to the invention, the noise is very low, since the ambient temperature is very low. For a conventional crystal mixer, the operation at a low temperature is not possible, on account of the considerable increase of the series resistance, which results in the conversion loss becoming very considerable, thus precluding the use of the crystal as a mixer at low temperatures.

It is to be understood that the arrangement described hereinabove and the figures given by way of example are not limitative. Thus, while a germanium transistor has been described, a sillicium transistor may be employed instead without departing from the invention, the operating temperature considered being in this case somewhat lower.

What is claimed is:

A circuit comprising, a transistor having a collector electrode, an emitter electrode, and a base electrode, said transistor having a punch-through voltage of less than 15 volts, means for connecting a signal source across said collector and emitter electrodes, the base electrode being unconnected, and means for maintaining the temperature of said transistor below −50° C.

References Cited in the file of this patent

UNITED STATES PATENTS

| | | |
|---|---|---|
| 2,721,936 | Byrne | Oct. 25, 1955 |
| 2,810,870 | Hunter et al. | Oct. 22, 1957 |
| 2,813,973 | McCoy et al. | Nov. 19, 1957 |
| 2,891,160 | Leblond | June 16, 1959 |
| 2,941,131 | Williams | June 14, 1960 |

OTHER REFERENCES

Article: "Voltage Punch-Through and Avalanche Breakdown . . . etc." Proceedings of National Electronics Conference, October 4, 5, 6, 1954, vol. X, pages 614 to 625.

Book: Crystal Rectifiers by Torrey & Whitner, vol. 15 of Radiation Lab. Series, McGraw-Hill, 1948, TK 6565 R42 T6, pages 194 and 195.

Article: "Alloyed Junction Avalanche Transistors," by Miller & Ebers, Bell System Tech. Journal, September 1955, pages 883 to 902.

Book: "Junction Transistor Electronics," by Hurley John Wiley & Son, 1958, pages 154 to 157.